United States Patent
Kim et al.

(10) Patent No.: US 10,964,915 B2
(45) Date of Patent: Mar. 30, 2021

(54) LIGHTING APPARATUS USING ORGANIC LIGHT EMITTING DIODE

(71) Applicant: LG DISPLAY CO., LTD., Seoul (KR)

(72) Inventors: Taemin Kim, Incheon (KR); Wonlk Jeong, Daejeon (KR); Hyunjun Park, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 54 days.

(21) Appl. No.: 16/454,415

(22) Filed: Jun. 27, 2019

(65) Prior Publication Data
US 2020/0006707 A1    Jan. 2, 2020

(30) Foreign Application Priority Data
Jun. 29, 2018  (KR) ........................ 10-2018-0075391

(51) Int. Cl.
*H01L 51/52*      (2006.01)

(52) U.S. Cl.
CPC ...... *H01L 51/5262* (2013.01); *H01L 51/5203* (2013.01); *H01L 51/5275* (2013.01)

(58) Field of Classification Search
CPC ............ H01L 51/5262; H01L 51/5203; H01L 51/5215; H01L 51/5212; H01L 51/5275; H01L 2251/5361
See application file for complete search history.

(56) References Cited

U.S. PATENT DOCUMENTS

| | | | | |
|---|---|---|---|---|
| 2010/0307791 | A1* | 12/2010 | Kim | H01L 51/0021 174/126.1 |
| 2013/0099258 | A1* | 4/2013 | Lim | H01L 51/5225 257/88 |
| 2015/0255526 | A1* | 9/2015 | Lee | H01L 51/5088 257/40 |
| 2016/0072092 | A1* | 3/2016 | Lee | H01L 27/32 257/40 |
| 2017/0194388 | A1* | 7/2017 | Kim | H01L 27/3211 |

FOREIGN PATENT DOCUMENTS

| | | | |
|---|---|---|---|
| JP | 2001223087 | * | 8/2001 |
| KR | 10-2009-0122022 A | | 11/2009 |
| KR | 10-1492842 B1 | | 2/2015 |

OTHER PUBLICATIONS

Machine Translation of JP-2001223087 (Year: 2001).*

* cited by examiner

*Primary Examiner* — Yasser A Abdelaziez
(74) *Attorney, Agent, or Firm* — Polsinelli PC

(57) ABSTRACT

A lighting apparatus including an organic light emitting diode includes an organic light emitting diode unit which includes an organic layer disposed on a substrate, wherein the organic light emitting diode emits light with an angle with respect to a normal direction of the organic layer; and an external light extracting layer which refracts the light emitted by the organic light emitting diode unit to the normal direction of the organic layer.

17 Claims, 14 Drawing Sheets

LIGHTING APPARATUS USING ORGANIC LIGHT EMITTING DIODE

CROSS-REFERENCE TO RELATED APPLICATION

This application claims the priority of Korean Patent Application No. 10-2018-0075391 filed on Jun. 29, 2018, in the Korean Intellectual Property Office, the disclosure of which is incorporated herein by reference in its entirety.

BACKGROUND

Field of the Disclosure

The present disclosure relates to a lighting apparatus using an organic light emitting diode, and more particularly, to a lighting apparatus using an organic light emitting diode with an improved front luminance.

Description of the Background

Currently, a fluorescent lamp or an incandescent lamp has been mainly used as lighting apparatuses. Among them, the incandescent lamp has a good color rendering index (CRI), but have a very low energy efficiency. Further, the fluorescent lamp has a high efficiency, but has a low color rendering index and contains mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the conventional lighting apparatus, recently, a light emitting diode (LED) is suggested as a lighting apparatus. The light emitting diode is composed of an inorganic light emitting material. A luminous efficiency of the light emitting diode is the highest in the blue wavelength range and the luminous efficiency thereof is lowered toward a red wavelength range and a green wavelength range which has the highest visibility. Therefore, there is a disadvantage in that when a red light emitting diode, a green light emitting diode, and a blue light emitting diode are combined to emit white light, the luminous efficiency is lowered.

As an alternative, a lighting apparatus using an organic light emitting diode (OLED) has been developed. The lighting apparatus using an organic light emitting diode emits light at various angles so that the luminance of the lighting apparatus is dispersed not only to the front, but also to the side.

Therefore, like a lighting apparatus of a vehicle, when there is a necessity to concentrate the front luminance, if the lighting apparatus using an organic light emitting diode is used as a lighting apparatus for a vehicle, there is a problem in that the front luminance does not reach a desirable reference value.

SUMMARY

The present disclosure is to provide a lighting apparatus using an organic light emitting diode with an improved front luminance.

The present disclosure is to provide a lighting apparatus using an organic light emitting diode suitable for a lighting apparatus of a vehicle.

The present disclosure is not limited to the above, which is not mentioned above, can be clearly understood by those skilled in the art from the following descriptions.

According to an aspect of the present disclosure, a lighting apparatus including an organic light emitting diode includes an organic light emitting diode unit which includes an organic layer disposed on a substrate, wherein the organic light emitting diode emits light with an angle with respect to a normal direction of the organic layer; and an external light extracting layer which refracts the light emitted by the organic light emitting diode unit to the normal direction of the organic layer.

According to another aspect of the present disclosure, a lighting apparatus includes an organic light emitting diode unit that performs surface emission, an encapsulating unit encapsulating the organic light emitting diode unit, wherein the organic light emitting diode unit includes a first electrode and a second electrode attached to both surfaces of the organic layer, wherein the first electrode includes an upper electrode in contact with the organic layer, an intermediate electrode in contact with the upper electrode, and a lower electrode in contact with the intermediate electrode; and an external light extracting layer including a plurality of protrusions each having a four-sided pyramid shape that refracts the light emitted from the organic light emitting diode unit to a front side of the lighting apparatus.

Other detailed matters of the exemplary aspects are included in the detailed description and the drawings.

According to the present disclosure, a first electrode is formed as a triple layer to deflect light generated by the organic light emitting diode unit.

According to the present disclosure, a unit structure of an external light extracting layer is formed to have a four-sided pyramid shape to improve the front luminance of the lighting apparatus.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
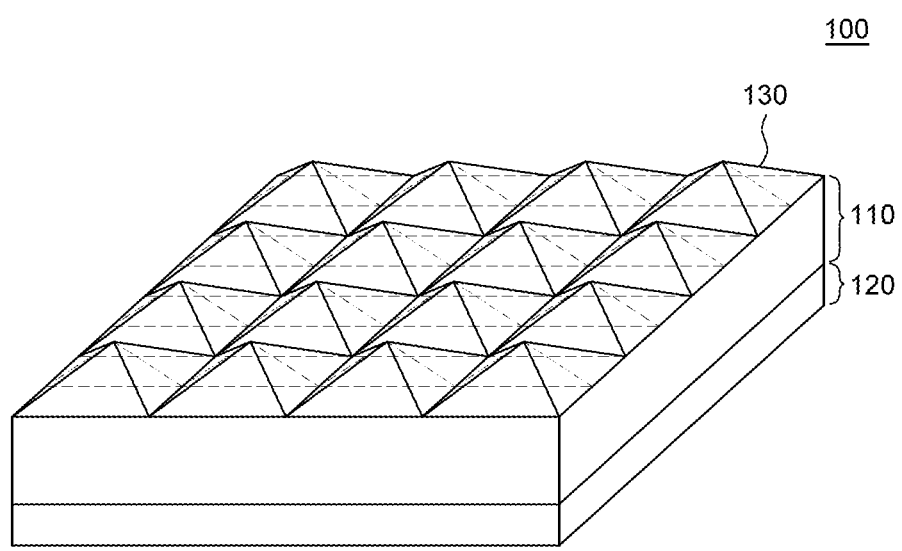
FIG. 1 is a perspective view of a lighting apparatus using an organic light emitting diode according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a lighting apparatus using an organic light emitting diode according to exemplary aspects of the present disclosure will be described in detail with reference to accompanying drawings.

Figure 2:
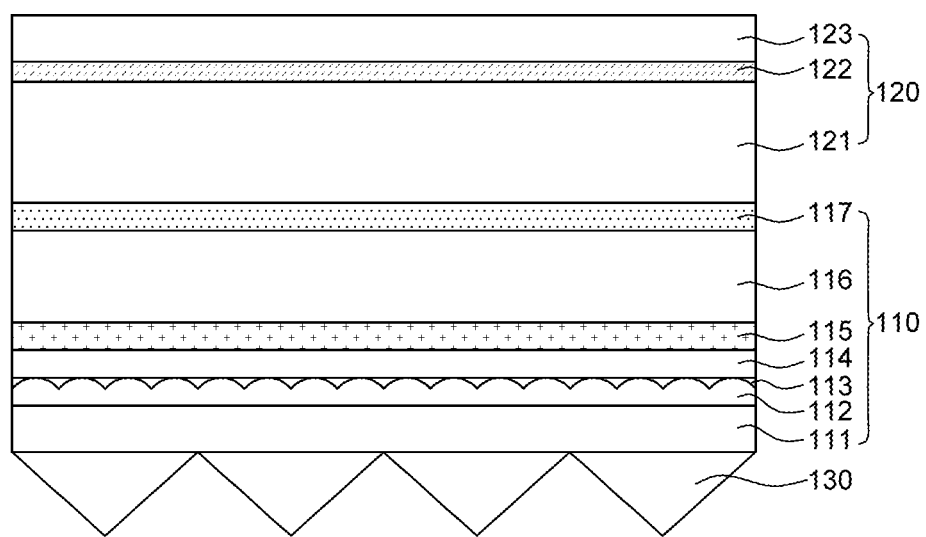
FIG. 2 is a cross-sectional view of a lighting apparatus using an organic light emitting diode according to an exemplary aspect of the present disclosure.

FIG. 1 is a perspective view of a lighting apparatus using an organic light emitting diode according to an exemplary aspect of the present disclosure and FIG. 2 is a cross-sectional view of a lighting apparatus using an organic light emitting diode according to an exemplary aspect of the present disclosure.

Referring to FIG. 1, a lighting apparatus 100 using an organic light emitting diode according to an exemplary aspect of the present disclosure includes an organic light emitting diode unit 110 which performs surface emission, an encapsulating unit 120 which encapsulates the organic light emitting diode unit 110, and an external light extracting layer 130 which refracts the light emitted from the organic light emitting diode unit 110 to the front side.

Specifically, referring to FIG. 2, the organic light emitting diode unit 110 may sequentially include a substrate 111, an internal light extracting layer 112, a planarizing layer 113, a barrier layer 114, a first electrode 115, an organic layer 116, and a second electrode 117 from the lower side.

In addition, as it will be described below with reference to FIG. 5, the organic light emitting diode unit 110 may further include an auxiliary line AL for compensating a conductivity of the first electrode 115 and an insulating layer INS for suppressing the short of the first electrode 115 and the second electrode 117.

The substrate 111 may be configured by a transparent glass. Further, the substrate 111 may be configured by a polymer material having flexibility.

Here, the organic layer 116 which emits light and the first electrode 115 and the second electrode 117 which are disposed on and below the organic layer 116 to supply charges to the organic layer 116 form an organic light emitting diode (OLED).

For example, the first electrode 115 may be an anode which supplies holes to the organic layer 116 and the second electrode 117 may be a cathode which supplies electrons to the organic layer 116, but are not limited thereto and the functions of the first electrode 115 and the second electrode 117 may be switched.

Generally, the first electrode 115 is desirably formed of indium tin oxide (ITO) or indium zinc oxide (IZO) which is a transparent metal oxide material having a high work function and good conductivity to easily inject the holes.

However, in the exemplary aspect of the present disclosure, the first electrode 115 which is a triple layer may be used to form a predetermined angle of the light generated by the organic light emitting diode unit 110 with respect to a normal direction (a vertical direction) of the organic layer 116. A detailed description thereof will be made below with reference to FIGS. 6C to 6F.

Further, the second electrode 117 is desirably configured by a conductive material having a low work function so as to easily inject electrons to the organic layer 116. As a specific example of a material used for the second electrode 117, a metal such as magnesium (Mg), calcium (Ca), sodium (Na), titanium (Ti), indium (In), yttrium (Y), lithium (Li), gadolinium (Gd), aluminum (Al), silver (Ag), tin (Sn), and lead (Pb), or an alloy thereof may be used.

The organic layer 116 may be configured by a single stack structure including a red organic light emitting layer EML or formed to have a multi-stack tandem structure including a plurality of red organic light emitting layers EML, or a multi-stack tandem structure including a red-green organic light emitting layer EML and a sky blue organic light emitting layer EML.

Further, the organic layer 116 may include an electron injection layer EIL and a hole injection layer HIL which inject electrons and holes to the organic light emitting layer EML, respectively and an electron transport layer ETL and a hole transport layer HTL which transport the injected electrons and holes to the light emitting layer, respectively, and a charge generating layer CGL which generates charges such as the electrons and the holes. A specific structure thereof will be described below with reference to FIGS. 3A to 3C.

When a current is applied to the first electrode 115 and the second electrode 117, the electrons are injected from the second electrode 117 to the organic layer 116 and the holes are injected from the first electrode 115 to the organic layer 116. Thereafter, excitons are generated by the organic layer 116. As the excitons are decayed, light corresponding an energy difference of a lowest unoccupied molecular orbital (LUMO) and a highest occupied molecular orbital (HOMO) of the light emitting layer is generated.

Here, it is determined whether the light generated by the organic layer 116 is emitted to the front side or to the rear side depending on a transmittance and a reflectance of the first electrode 115 and the second electrode 117.

In the exemplary aspect of the present disclosure, as described above, the first electrode 115 is used as a transparent electrode and the second electrode 117 is used as a reflective electrode. Therefore, the light emitted from the organic layer 116 is reflected by the second electrode 117 to transmit the first electrode 115 so that the light is generated to the lower portion of the organic light emitting diode unit 110. That is, the organic light emitting diode unit 110 according to an exemplary aspect of the present disclosure may perform bottom emission.

However, it is not limited thereto and the first electrode 115 is used as a reflective electrode and the second electrode 117 is used as a transparent electrode so that the organic light emitting diode unit 110 may perform top emission.

The barrier layer 114 is disposed below the first electrode 115 to block moisture and air penetrating from the substrate 111 and the internal light extracting layer 112.

In order to perform the above-mentioned function, the barrier layer 114 may be formed of a single layer of an inorganic material such as silicon oxide SiOx or silicon nitride SiNx. If necessary, the barrier layer 114 may be formed by a composite layer of an inorganic material and an organic material.

The internal light extracting layer 112 is disposed between the substrate 111 and the barrier layer 114 to increase the external extracting efficiency of the light generated from the organic light emitting diode which performs the bottom emission.

The internal light extracting layer 112 is formed of resin with titanium oxide TiO2 particles inserted therein to increase internal light scattering and surface roughness, thereby increasing an optical extraction efficiency. Specifically, the internal light extracting layer 112 may be formed to have a thickness of 450 nm by an inkjet-coating method and a diameter of titanium oxide TiO2 particle may be 200 nm to 300 nm. However, the specific value may vary to various values depending on the necessity of the design of the lighting apparatus 100.

The planarizing layer 113 is disposed on the internal light extracting layer 112 to compensate the surface roughness of the internal light extracting layer 112, thereby improving the reliability of the organic light emitting diode unit 110.

The planarizing layer 113 is made by inserting zirconia particles into resin and compensates the surface roughness of the internal light extracting layer 112. Specifically, the planarizing layer 113 may be formed by the inkjet-coating method to have a thickness of 150 nm and a diameter of the zirconia particle may be 50 nm. However, the specific value may vary to various values depending on the necessity of the design of the lighting apparatus 100.

An encapsulating unit 120 covers the organic light emitting diode unit 110 to protect the organic light emitting diode unit 110 by blocking the influence from the outside. The encapsulating unit 120 includes an adhesive layer 121 which is in contact with the second electrode 117, a metal film 122 which is in contact with the adhesive layer 121, and a protective film 123 attached onto the metal film 122.

The adhesive layer 121 may be configured by a pressure sensitive adhesive (PSA) which bonds the metal film 122 and the organic light emitting diode unit 110. A thickness of the adhesive layer 121 may be 30 m, but is not limited thereto and may vary to various values depending on the necessity of the design of the lighting apparatus 100.

The metal film 122 is disposed on the adhesive layer 121 to maintain the rigidity of the lighting apparatus 100. To this end, the metal film 122 may be formed of copper (Cu) having a thickness of 20 m, but is not limited thereto and may vary in various forms depending on the necessity of the design of the lighting apparatus 100.

The protective film 123 is disposed on the metal film 122 to absorb the external impact of the lighting apparatus 100 and protect the lighting apparatus 100. To this end, the protective film 123 may be formed of a polyethylene terephthalate (PET) film which is a polymer film having a thickness of 100 m, but is not limited thereto and may vary in various forms depending on the necessity of the design of the lighting apparatus 100.

Figure 3A:
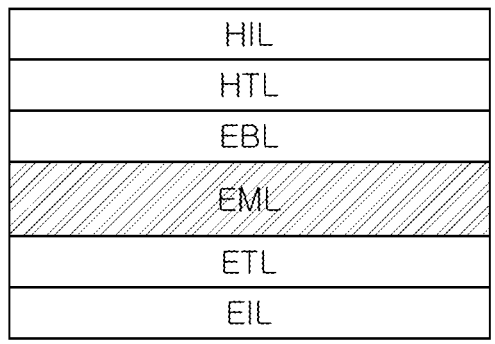
FIGS. 3A, 3B and 3C are cross-sectional views illustrating a stack structure of an organic layer according to an exemplary aspect of the present disclosure.
Figure 3B:
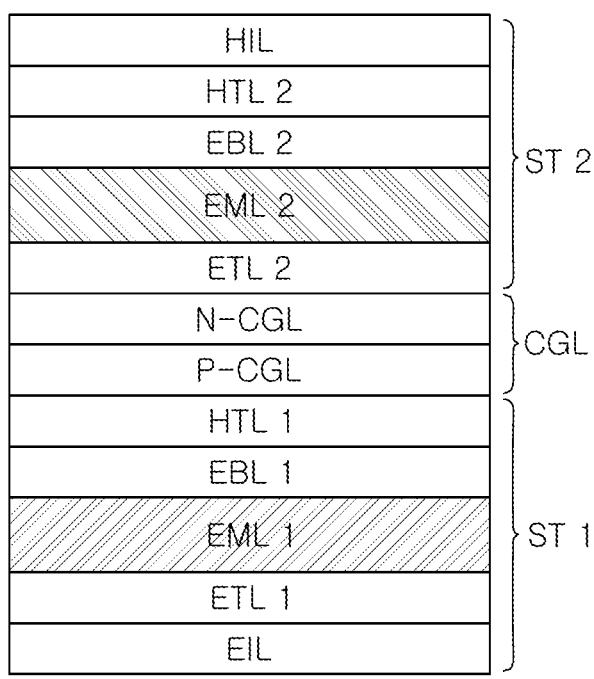
Figure 3C:
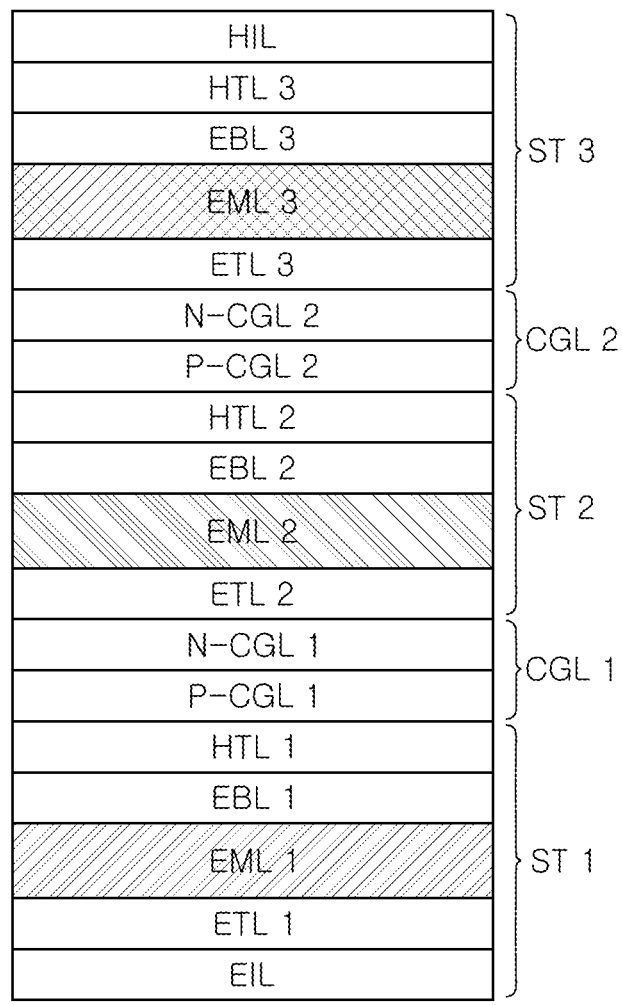

FIGS. 3A to 3C are cross-sectional views illustrating a stack structure of an organic layer according to an exemplary aspect of the present disclosure.

Specifically, FIG. 3A illustrates an organic layer 116 having a single stack, FIG. 3B illustrates an organic layer 116 having a tandem structure including a double stack, and FIG. 3C illustrates an organic layer 116 having a tandem structure including a triple stack.

Referring to FIG. 3A, the organic layer 116 comprises a hole injection layer (HIL), a hole transport layer (HTL), an electron blocking layer (EBL), an organic light emitting layer (EML), an electron transport layer (ETL), and an electron injection layer (EIL) which are sequentially laminated.

The hole injection layer HIL is an organic layer which smoothly injects the hole from the first electrode 115 to the organic light emitting layer EML. The hole injection layer HIL may be formed of a material including any one or more of HAT-CN (dipyrazino[2,3-f:2',3'-h]quinoxaline-2,3,6,7,10.11-hexacarbonitrile), CuPc (phthalocyanine), F4-TCNQ (2,3,5,6-tetrafluoro-7,7,8,8-tetracyano-quinodimethane), and NPD (N,N'-bis(naphthalene-1-yl)-N,N'-bis(phenyl)-2,2'-dimethylbenzidine), but is not limited thereto.

The hole transport layer HTL is an organic layer which smoothly transmits the holes from the hole injection layer HIL to the organic light emitting layer EML. For example, the hole transport layer HTL may be formed of a material including any one or more of NPD (N,N'-bis(naphthalene-1-yl)-N,N'-bis(phenyl)-2,2'-dimethylbenzidine), TPD (N,N'-bis-(3-methylphenyl)-N,N'-bis-(phenyl)-benzidine), s-TAD (2,2',7,7'-tetrakis(N,N-dimethylamino)-9,9-spirofluorene), and MTDATA (4,4',4"-Tris(N-3-methylphenyl-N-phenyl-amino)-triphenylamine), but is not limited thereto.

The electron blocking layer EBL is an organic layer which blocks the electron injected into the organic light emitting layer EML from crossing over the hole transport layer HTL. The electron blocking layer EBL blocks the movement of the electron to improve the combination of the hole and the electron in the organic light emitting layer EML and improve a luminous efficiency of the organic light emitting layer EML. Even though the electron blocking layer EBL may be formed of the same material as the hole transport layer HTL and the hole transport layer HTL and the electron blocking layer EBL may be formed as different layers, it is not limited thereto and the hole transport layer HTL and the electron blocking layer EBL may be combined.

In the organic light emitting layer EML, the holes supplied through the first electrode 115 and the electrons supplied through the second electrode 117 are recombined to generate excitons. Here, an area where the excitons are generated is referred to as an emission area (or emission zone) or a recombination zone.

The organic light emitting layer (EML) is disposed between the hole transport layer HTL and the electron transport layer ETL and includes a material which emits light having a specific color. In this case, the organic light emitting layer EML may include a material which emits red light.

The organic light emitting layer EML may have a host-dopant system, that is, a system in which a host material having a large weight ratio is doped with an emission dopant material having a small weight ratio.

In this case, the organic light emitting layer EML may include a plurality of host materials or include a single host material. The organic light emitting layer EML including a plurality of host materials or a single host material is doped with a red phosphorescent dopant material. That is, the organic light emitting layer EML is a red light emitting layer and a range of a wavelength of light emitted from the organic light emitting layer EML may be 600 nm to 660 nm.

The red phosphorescent dopant material is a material which is capable of emitting red light. An EL spectrum of light emitted from the organic light emitting layer EML doped with the red phosphorescent dopant material has a peak in a red wavelength area or has a peak in a wavelength area corresponding to red.

The red phosphorescent dopant material may be formed of a material including any one or more of a iridium (Ir) ligand complex including Ir(ppy)3(fac tris(2-phenylpyridine)iridium)(tris(2-phenylpyridine)iridium), PIQIr(acac) (bis(1-phenylisoquinoline) acetylacetonate iridium), PQIr (acac)(bis(1-phenylquinoline) acetylacetonate iridium), PQIr(tris(1-phenylquinoline) iridium) Ir(piq)3 (tris(1-phenylisoquinoline)iridium), and Ir(piq)2(acac)(bis(1-phenylisoquinoline)(acetylacetonate)iridium), PtOEP (octaethylporphyrinporphine platinum) PBD:Eu(DBM)3(Phen), and perylene, but is not limited thereto.

The electron transport layer ETL is supplied with electrons from the electron injection layer EIL. The electron transport layer ETL transmits the supplied electrons to the organic light emitting layer EML.

Further, the electron transport layer ETL performs the same function as a hole blocking layer HBL. The hole blocking layer may suppress the holes which do not participate the recombination from being leaked from the organic light emitting layer EML.

For example, the electron transport layer ETL may be formed of any one or more of Liq (8-hydroxyquinolinolato-lithium), PBD (2-(4-biphenyl)-5-(4-tert-butylphenyl)-1,3,4-oxadiazole), TAZ (3-(4-biphenyl)4-phenyl-5-tert-butylphenyl-1,2,4-triazole), BCP (2,9-Dimethyl-4,7-diphenyl-1,10-phenanthroline), and BAlq (bis(2-methyl-8-quinolinolate)-4-(phenylphenolato)aluminum), but is not limited thereto.

The electron injection layer EIL is a layer which smoothly injects the electron from the second electrode 117 to the organic light emitting layer EML. For example, the electron injection layer EIL may be formed of a material including any one or more of alkali metals or alkaline earth metal ion forms such as LiF, BaF2, and CsF, but is not limited thereto.

The electron injection layer EIL and the electron transport layer ETL may be omitted depending on a structure or a characteristic of the lighting apparatus 100 using an organic light emitting diode.

Referring to FIG. 3B, the organic layer 116 includes a first stack ST1 including a first organic light emitting layer EML1, a second stack ST2 including a second organic light emitting layer EML2, and a charge generating layer CGL disposed between the first stack ST1 and the second stack ST2.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, a second hole transport layer HTL2, and a hole injection layer HIL and the function and the configuration of each layer are as described above.

In the meantime, the charge generating layer CGL is disposed between the first stack ST1 and the second stack ST2. The charge generating layer CGL supplies charges to the first stack ST1 and the second stack ST2 to control a charge balance between the first stack ST1 and the second stack ST2.

The charge generating layer CGL includes an N-type charge generating layer N-CGL and a P-type charge generating layer P-CGL. The N-type charge generating layer N-CGL is in contact with the second electron transport layer ETL2 and the P-type charge generating layer P-CGL is disposed between the N-type charge generating layer N-CGL and the first hole transport layer HTL1. The charge generating layer CGL may be configured by a plurality of layers including the N-type charge generating layer N-CGL and the P-type charge generating layer P-CGL, but is not limited thereto and may be configured by a single layer.

The N-type charge generating layer N-CGL injects the electrons to the first stack ST1. The N-type charge generating layer N-CGL may include an N-type dopant material and an N-type host material. The N-type dopant material may be a metal of Group 1 and Group 2 on the periodic table, an organic material which may inject the electrons, or a mixture thereof. For example, the N-type dopant material may be any one of an alkali metal and an alkaline earth metal. That is, the N-type charge generating layer N-CGL may be formed of the organic layer 116 doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material may be formed of a material which is capable of transmitting electrons, for example, may be formed of any one or more of Alq3(tris (8-hydroxyquinolino)aluminum), Liq(8-hydroxyquinolinolato-lithium), PBD (2-(4-biphenylyl)-5-(4-tert-butylphenyl)-1,3,4oxadiazole), TAZ (3-(4-biphenyl)4-phenyl-5-tert-butylphenyl-1,2,4-triazole), spiro-PBD, BAlq (bis(2-methyl-8-quinolinolate)-4-(phenylphenolato)aluminium), SAlq, TPBi (2,2',2-(1,3,5-benzinetriyl)-tris(1-phenyl-1-H-benzimidazole), oxadiazole, triazole, phenanthroline, benzoxazole, and benzthiazole, but is not limited thereto.

The P-type charge generating layer P-CGL injects the holes to the second stack ST2. The P-type charge generating layer P-CGL may include a P-type dopant material and a P-type host material. The P-type dopant material may be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as V2O5, MoOx, and WO3, but is not limited thereto. The P-type host material may be formed of a material which is capable of transmitting holes, for example, may be formed of a material including any one or more of NPD (N,N-dinaphthyl-N,N'-diphenyl benzidine)(N,N'-bis(naphthalene-1-yl)-N,N'-bis(phenyl)-2,2'-dimethylbenzidine), TPD (N,N'-bis-(3-methylphenyl)-N,N'-bis-(phenyl)-benzidine), and MTDATA (4,4',4-Tris(N-3-methylphenyl-N-phenyl-amino)-triphenylamine), but is not limited thereto.

Referring to FIG. 3C, the organic layer 116 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, and a second hole transport layer HTL2. The third stack ST3 includes a third electron transport layer ETL3, a third organic light emitting layer EML3, a third electron blocking layer EBL3, a third hole transport layer HTL3, and a hole injection layer HIL. The function and the configuration of each layer are as described above.

The first charge generating layer CGL1 includes a first N-type charge generating layer N-CGL1 and a first P-type charge generating layer P-CGL1 and the first N-type charge generating layer N-CGL1 is in contact with the second electron transport layer ETL2. The first P-type charge generating layer P-CGL1 is disposed between the first N-type charge generating layer N-CGL1 and the first hole transport layer HTL1.

The second charge generating layer CGL2 includes a second N-type charge generating layer N-CGL2 and a second P-type charge generating layer P-CGL2 and the second N-type charge generating layer N-CGL2 is in contact with the third electron transport layer ETL3. The second P-type charge generating layer P-CGL2 is disposed between the second N-type charge generating layer N-CGL2 and the second hole transport layer HTL2. The functions and configurations of the first and second charge generating layers CGL1 and CGL2 are as described above.

Here, the first organic light emitting layer EML1 and the third organic light emitting layer EML3 are red-green organic light emitting layers and a range of a wavelength of light emitted from the first organic light emitting layer EML1 and the third organic light emitting layer EML3 may be 520 nm to 580 nm. The second organic light emitting layer EML2 is a sky blue organic light emitting layer and a range of a wavelength of light emitted from the second organic light emitting layer EML2 may be 450 nm to 480 nm.

Figure 4A:
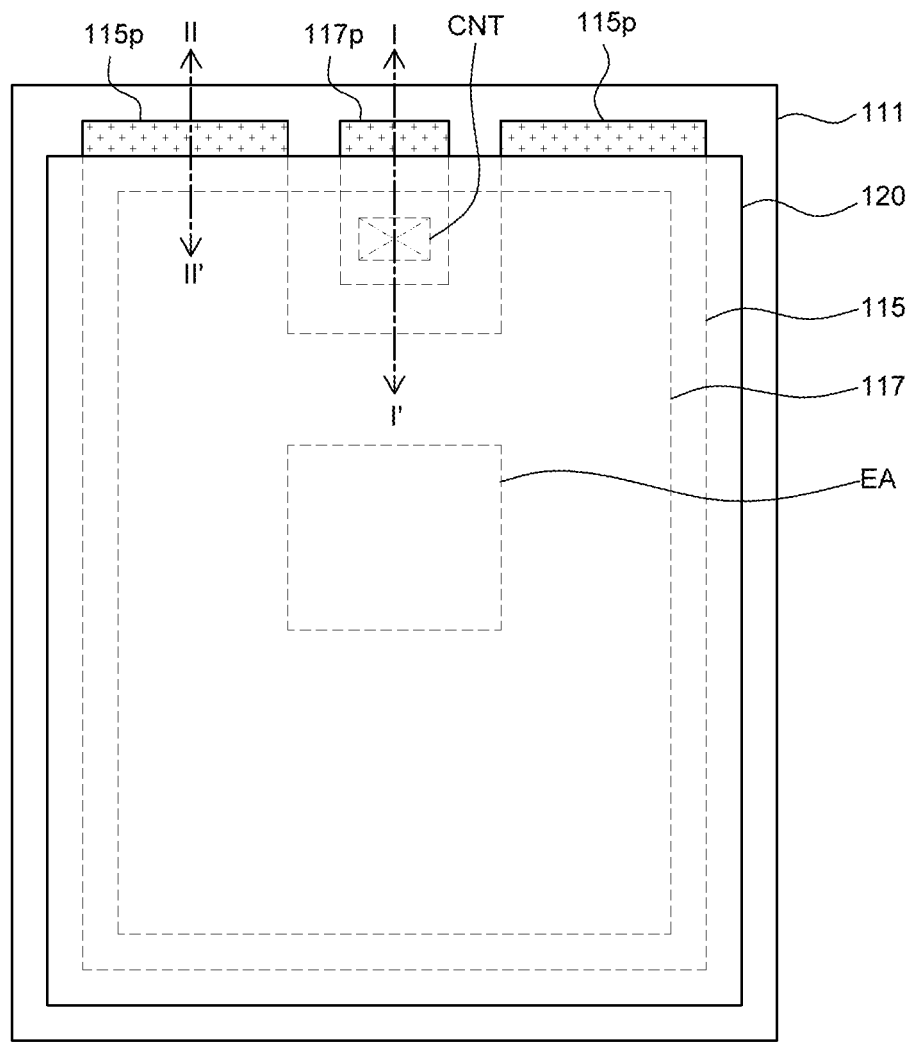
FIG. 4A is a front view of a lighting apparatus using an organic light emitting diode according to an exemplary aspect of the present disclosure.
Figure 4B:
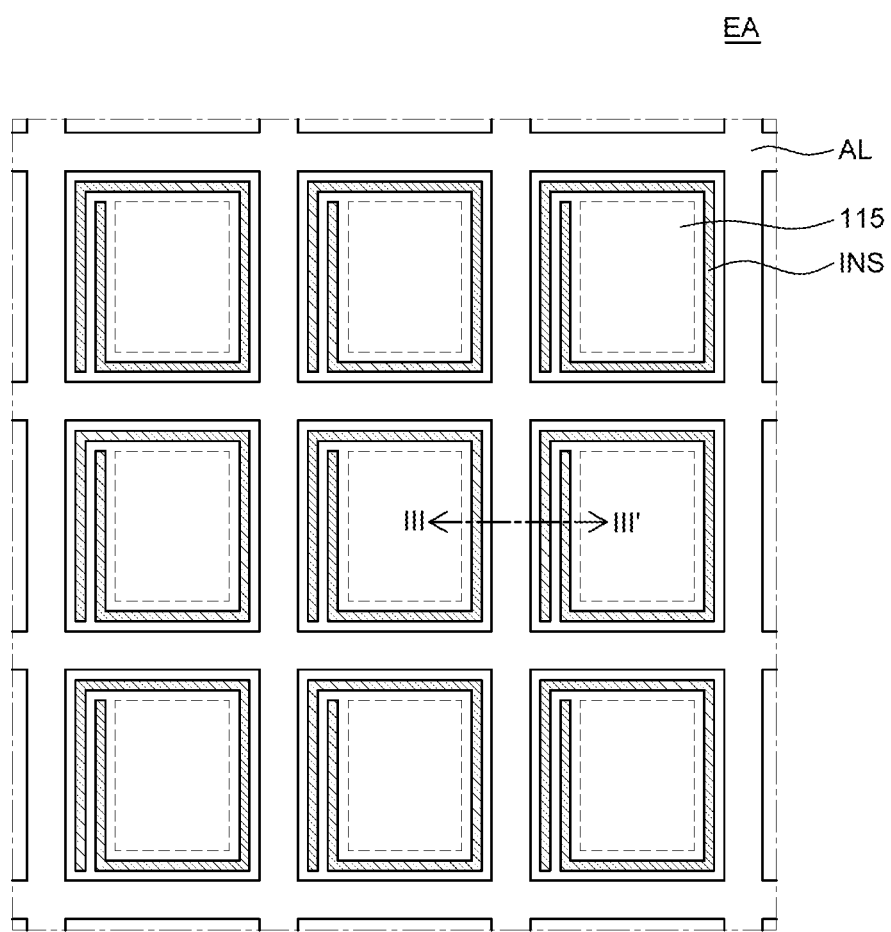
FIG. 4B is an enlarged view of a lighting unit of a lighting apparatus using an organic light emitting diode according to an exemplary aspect of the present disclosure.

FIG. 4A is a front view of a lighting apparatus using an organic light emitting diode according to an exemplary aspect of the present disclosure and FIG. 4B is an enlarged view of a lighting unit of a lighting apparatus using an organic light emitting diode according to an exemplary aspect of the present disclosure.

Figure 5:
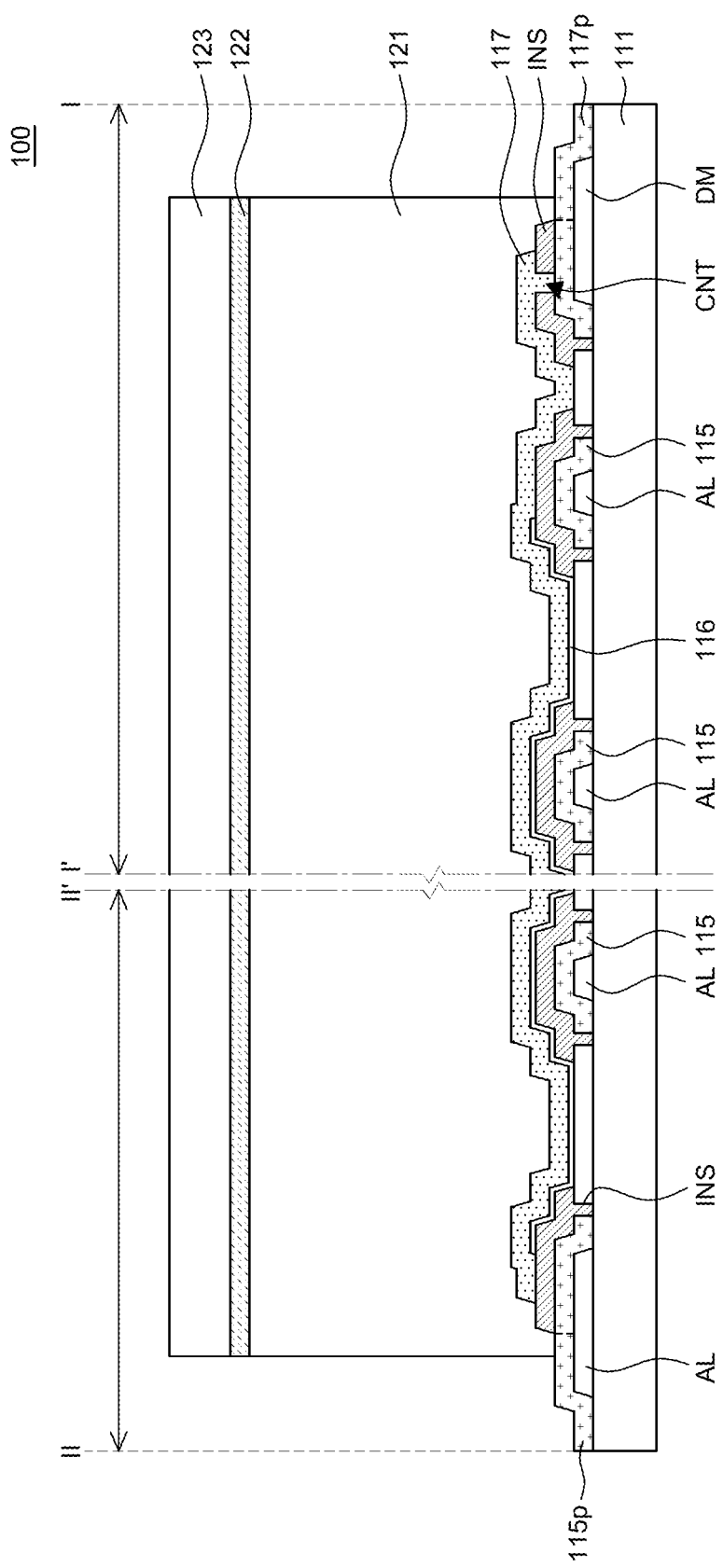
FIG. 5 is a cross-sectional view taken along lines I-I' and II-II' of FIG. 4A.

FIG. 5 is a cross-sectional view taken along the lines I-I' and II-II' of FIG. 4A.

Specifically, FIG. 4A illustrates an arrangement relationship of the first electrode 115, the second electrode 117, and the encapsulating unit 120. A cross-sectional view of FIG. 5 taken along the line I-I' explains a connection relationship between the second electrode 117 and the second contact electrode 117p and a cross-sectional view of FIG. 5 taken along the line II-II' explains a connection relationship between the first electrode 115 and the first contact electrode 115p.

As illustrated in FIGS. 4A and 5, the first electrode 115 is disposed on the substrate 111, the second electrode 117 is disposed on the first electrode 115, and the encapsulating unit 120 is disposed so as to cover the second electrode 117.

Here, the overlapping area of the first electrode 115 and the second electrode 117 may be defined as a lighting unit EA where light is generated from the organic layer 116 disposed between the first electrode 115 and the second electrode 117.

The first electrode 115 is formed of a transparent conductive layer to have an advantage in that the emitted light transmits the first electrode, but also have a disadvantage in that an electric resistance is very high as compared with an opaque metal. Therefore, when a large size lighting apparatus 100 is manufactured, the distribution of the current applied to a large lighting unit EA is not uniform due to a high resistance of the transparent high resistance conductive layer and the large size lighting apparatus cannot emit light with uniform luminance due to the current distribution which is not uniform.

Therefore, as illustrated in FIGS. 4B and 5, for the purpose of emission with uniform luminance of the large size lighting apparatus 100, an auxiliary line AL which is electrically connected to the first electrode 115 which makes the distribution of current applied to the lighting unit EA uniform may be disposed.

The auxiliary line AL is disposed over the entire lighting unit EA with a net shape having a small thickness, a mesh shape, a hexagonal or octagonal shape, or a circular shape. The auxiliary line AL may be composed of a metal having a good conductivity such as aluminum (Al), gold (Au), copper (Cu), titanium (Ti), tungsten (W), molybdenum (Mo), or an alloy thereof. Even though not illustrated in the drawing, the auxiliary line AL may be configured to have a double-layered structure of an upper auxiliary line AL and a lower auxiliary line AL, but the present disclosure is not limited thereto and the auxiliary line may be configured by a single layer.

Here, in FIG. 5, it is illustrated that the auxiliary line AL which is electrically connected to the first electrode 115 is disposed below the first electrode 115 to be in electrical contact with the first electrode 115. However, the present disclosure is not limited thereto and the auxiliary line AL may be disposed above the first electrode 115.

Moreover, when the first electrode 115 is formed as a triple layer, the auxiliary line AL may be disposed between the triple layers of the first electrode 115 and a detailed description thereof will be made below with reference to FIGS. 6C to 6F.

Further, as illustrated in FIG. 4A, the first electrode 115 may be configured by an electrode layer in which a recession is formed at a center portion of one side and a first contact electrode 115P which is electrically connected to the first electrode 115 through the auxiliary line AL may extend to be disposed on both ends of one side. However, the shape of the first electrode 115 is not limited thereto, but the first electrode 115 may be formed in various shapes in which a recession is formed.

Further, a second contact electrode 117p which is separated from the first electrode 115 may be disposed in the recession of one side of the first electrode 115. As illustrated in FIG. 5, the second contact electrode 117p is electrically connected to the second electrode 117 through a connection hole CNT.

Specifically, as illustrated in FIG. 5, the first contact electrode 115p is connected to the first electrode 115 through the auxiliary line AL to form an equipotential surface with the first electrode 115. Therefore, the first contact electrode 115p, the auxiliary line AL, and the first electrode 115 are electrically connected to each other. Further, as illustrated in FIG. 5, the second contact electrode 117p is electrically connected to the second electrode 117 and a dummy electrode DM.

The above-mentioned dummy electrode DM is formed of the same material on the same layer as the auxiliary line AL and is disposed in the recession to be electrically isolated from the auxiliary line AL. Therefore, the first electrode 115 and the second electrode 117 are not electrically connected to supply the current to the organic layer 116.

Here, the first contact electrode 115p and the second contact electrode 117p may be formed of a metal having a high conductivity and specifically, the first contact electrode 115p and the second contact electrode 117p may be formed of the same material on the same layer as the first electrode 115. Therefore, as it will be described below, the first electrode 115 may be formed by a triple-layered electrode pattern so that the first contact electrode 115p and the second contact electrode 117p may also be formed of a triple-layered electrode pattern like the first electrode 115.

The encapsulating unit 120 is formed so as to cover both the first electrode 115 and the second electrode 117, but exposes the first contact electrode 115p and the second contact electrode 117p. By doing this, the first contact electrode 115p and the second contact electrode 117p may be electrically connected to the outside. Therefore, the first electrode 115 may be applied with a signal through the first contact electrode 115p which is connected to the outside and the second electrode 117 may be connected to the outside through the second contact electrode 117p which is connected to the outside.

An insulating layer INS is disposed between the first electrode 115 and the second electrode 117 on a non-emission area where the auxiliary line AL of the lighting unit EA is disposed to suppress the short between the first electrode 115 and the second electrode 117 due to the damage of the organic layer 116.

Specifically, the insulating layer INS is configured to cover the auxiliary line AL and the first electrode 115 of the non-emission area above the auxiliary line. As described above, the insulating layer INS is formed so as to enclose the auxiliary line AL to reduce the step due to the auxiliary line AL. Therefore, various layers which are formed thereafter may be stably formed without being shorted. The insulating layer INS may be configured by an inorganic material such as silicon oxide SiOx or silicon nitride SiNx. However, the insulating layer INS may be configured by an organic material such as photoacryl and also configured by a plurality of layers of inorganic materials and organic materials.

Further, as illustrated in FIG. 4B, the insulating layer INS forms a short reduction pattern in the first electrode 115 to which the current is supplied to reflect a narrow path and is insulated to cover the short reduction pattern, thereby suppressing the short. That is, the short reduction pattern is formed to enclose an outer edge of the emission area of the individual pixel and adds a resistor to the individual pixels to restrict current flowing in an area where the short is generated.

FIGS. 6A to 6F are cross-sectional views taken along the line III-III' of FIG. 4B.

Figure 6A:
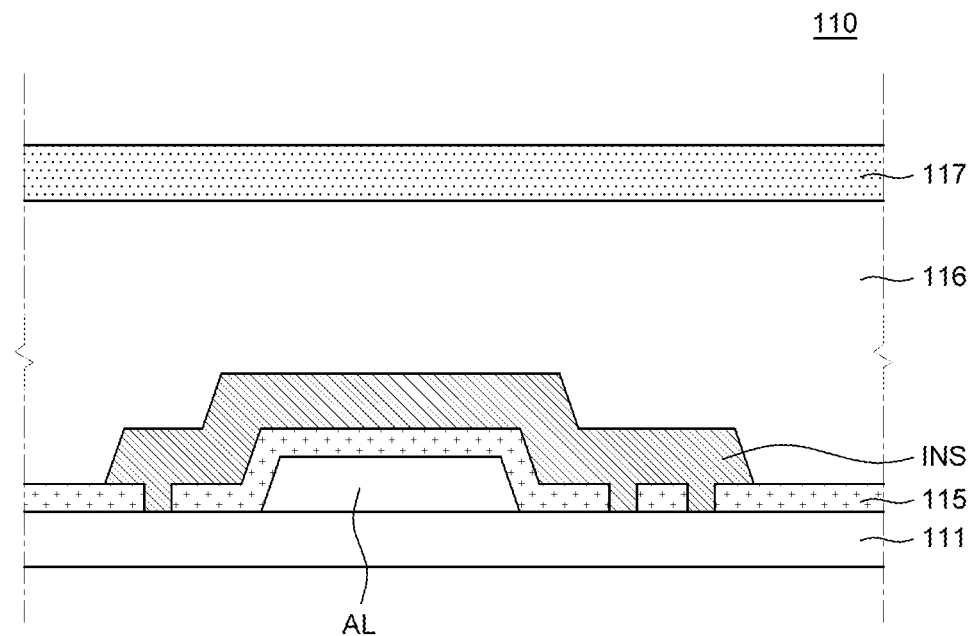
FIGS. 6A, 6B, 6C, 6D, 6E and 6F are cross-sectional views taken along line III-III' of FIG. 4B.
Figure 6B:
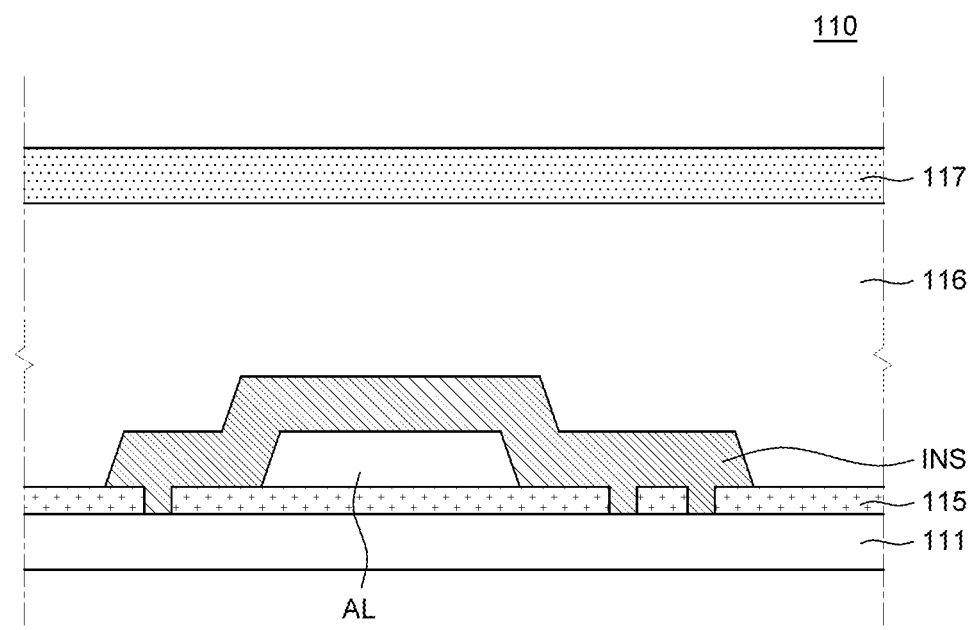

Specifically, FIGS. 6A and 6B illustrate a first electrode 115 which is a single layer and FIGS. 6C, 6D, 6E and 6F illustrate a first electrode 115 which is a triple layer.

Referring to FIG. 6A, in the lighting apparatus 100 using an organic light emitting diode according to an exemplary aspect of the present disclosure, the auxiliary line AL may be disposed on the substrate 111 and the first electrode 115 which is a single layer may be formed so as to cover the auxiliary line AL. Further, the insulating layer INS may be formed on the first electrode 115 which is a single layer so as to overlap the auxiliary line AL.

In other words, the insulating layer INS is disposed in a non-emission area by the auxiliary line AL formed of an opaque metal.

The organic layer 116 and the second electrode 117 are sequentially disposed on the first electrode 115 in which the insulating layer INS is formed.

Referring to FIG. 6B, according to another exemplary aspect of the present disclosure, the first electrode 115 which is a single layer may be disposed on the entire substrate 111 and the auxiliary line AL may be disposed on the first electrode 115. Further, the insulating layer INS may be formed on the auxiliary line AL so as to overlap the auxiliary line AL.

Here, when the first electrode 115 is a single layer, the first electrode 115 may be formed of indium tin oxide ITO or indium zinc oxide IZO which is a transparent metal oxide material having a good conductivity.

Further, in FIGS. 6C to 6F, the first electrode 115 may be formed as a triple-layered electrode.

Specifically, the first electrode 115 may be configured to include a lower electrode 115a, an intermediate electrode 115b, and an upper electrode 115c which are sequentially laminated on the substrate 111.

In other words, the first electrode 115 may include the upper electrode 115c which is in contact with the organic layer 116, the intermediate electrode 115b which is in contact with the upper electrode 115c, and the lower electrode 115a which is in contact with the intermediate electrode 115b.

Further, as illustrated in FIGS. 6C to 6F, the auxiliary line AL may be disposed inside or outside the first electrode 115 which is a triple layer in various forms.

Figure 6C:
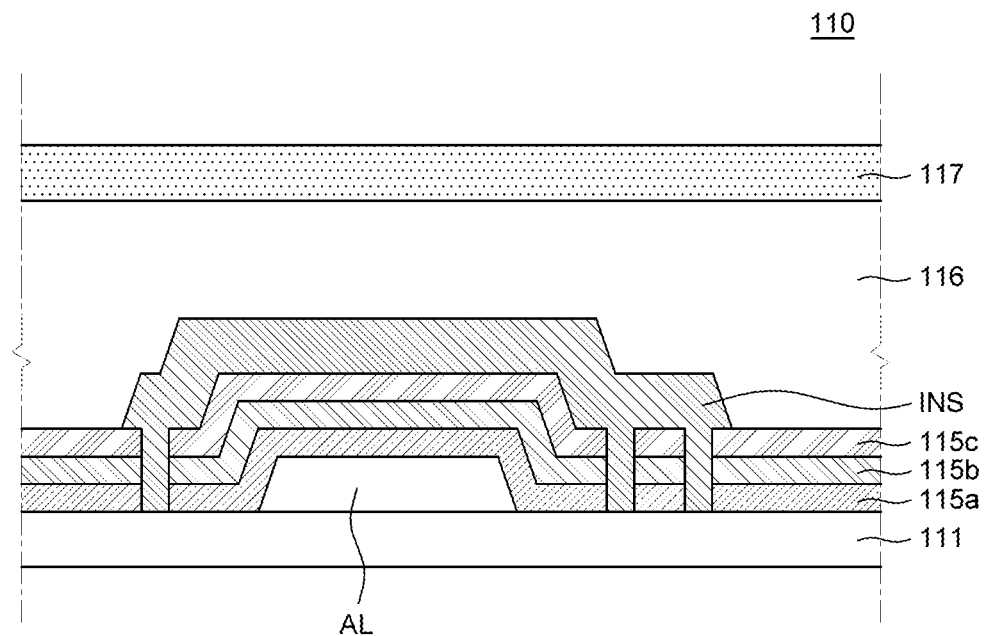

According to an exemplary aspect of the present disclosure, as illustrated in FIG. 6C, the auxiliary line AL is disposed on the substrate 111 and the lower electrode 115a, the intermediate electrode 115b, and the upper electrode 115c are sequentially disposed on the auxiliary line AL. That is, the auxiliary line AL may be disposed between the lower electrode 115a and the substrate 111.

Thereafter, the insulating layer INS, the organic layer 116, and the second electrode 117 may be sequentially disposed on the upper electrode 115c.

Figure 6D:
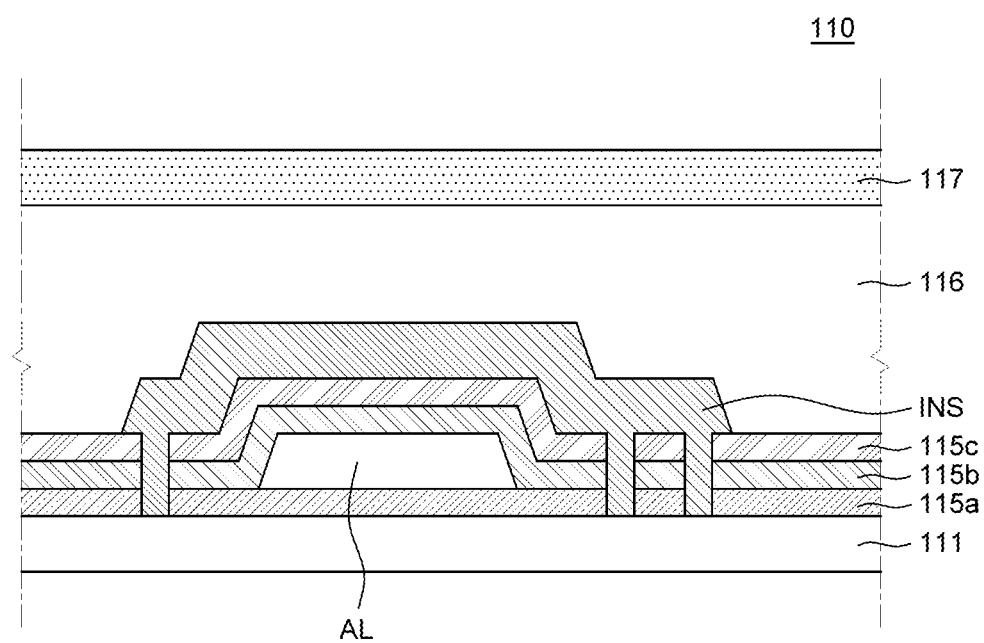

According to another exemplary aspect of the present disclosure, as illustrated in FIG. 6D, the lower electrode 115a may be disposed on the substrate 111 and the auxiliary line AL may be disposed on the lower electrode 115a. Further, the intermediate electrode 115b and the upper electrode 115c may be sequentially disposed so as to cover the auxiliary line AL. That is, the auxiliary line AL may be disposed between the intermediate electrode 115b and the lower electrode 115a.

Thereafter, the insulating layer INS, the organic layer 116, and the second electrode 117 may be sequentially disposed on the upper electrode 115c.

Figure 6E:
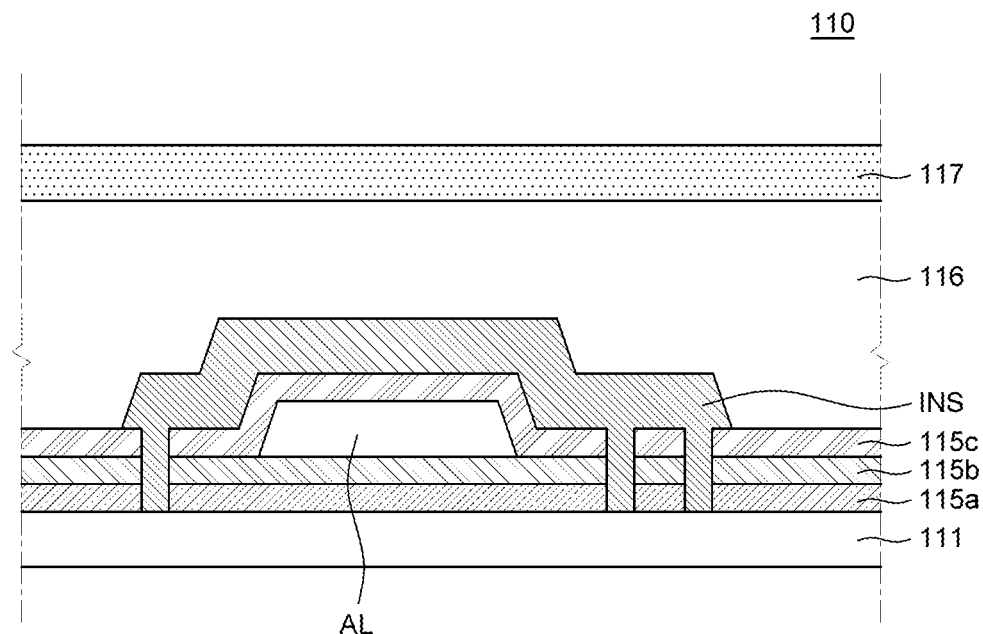

According to still another exemplary aspect of the present disclosure, as illustrated in FIG. 6E, the lower electrode 115a and the intermediate electrode 115b are sequentially disposed on the substrate 111 and the auxiliary line AL is disposed on the intermediate electrode. Further, the upper electrode 115c may be disposed so as to cover the auxiliary line AL. That is, the auxiliary line AL may be disposed between the upper electrode 115c and the intermediate electrode 115b.

Thereafter, the insulating layer INS, the organic layer 116, and the second electrode 117 may be sequentially disposed on the upper electrode 115c.

Figure 6F:
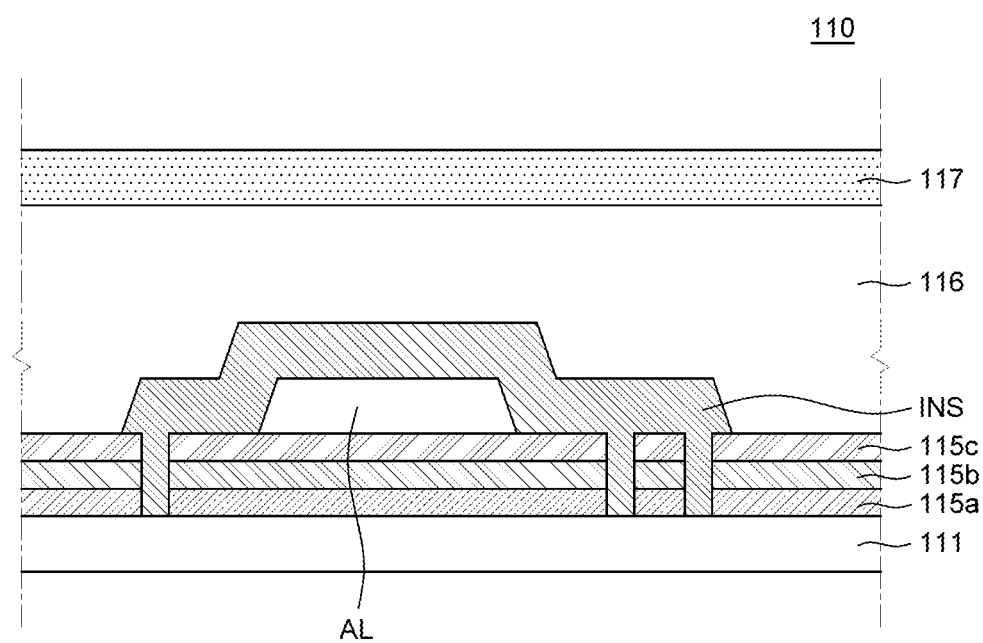

According to still another exemplary aspect of the present disclosure, as illustrated in FIG. 6F, the lower electrode 115a, the intermediate electrode 115b, and the upper electrode 115c are sequentially disposed on the substrate 111 and the auxiliary line AL may be disposed on the upper electrode 115c.

Thereafter, the insulating layer INS, the organic layer 116, and the second electrode 117 may be sequentially disposed so as to cover the auxiliary line AL. That is, the auxiliary line AL may be disposed between the organic layer 116 and the upper electrode 115c.

As described above, the first electrode 115 is formed as a triple layer so that the light may be emitted from the organic light emitting diode including the first electrode 115, the second electrode 117, and the organic layer 116 with an angle with respect to a normal direction of the organic layer 116.

Specifically, the upper electrode 115c is indium tin oxide (ITO) having a thickness which is smaller than 1000 Å, the intermediate electrode 115b is silver (Ag) which is a metal having a thickness of 150 Å to 350 Å. Further, the lower electrode 115a may be a dielectric having a refractive index of 1.4 to 1.5.

In this case, the light may be emitted from the organic light emitting diode unit 110 to form an angle of 15 to 20 with the normal direction of the organic layer 116. Details thereof will be described below with reference to FIG. 7.

Figure 7:
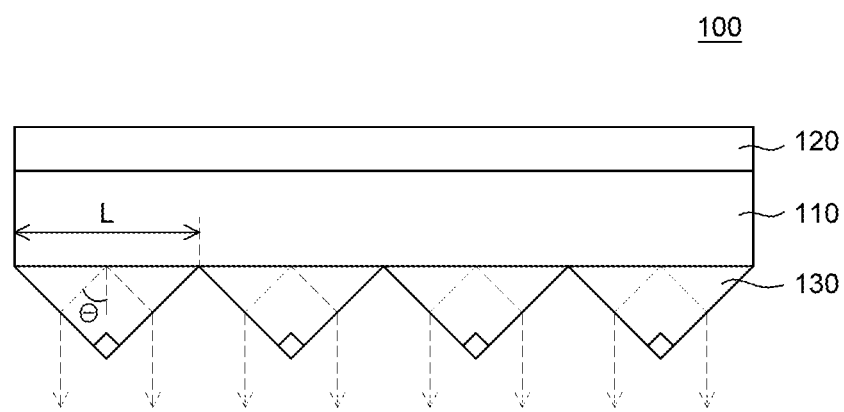
FIG. 7 is a view illustrating an emission path of a lighting apparatus including an organic light emitting diode according to an exemplary aspect of the present disclosure.
Figure 8:
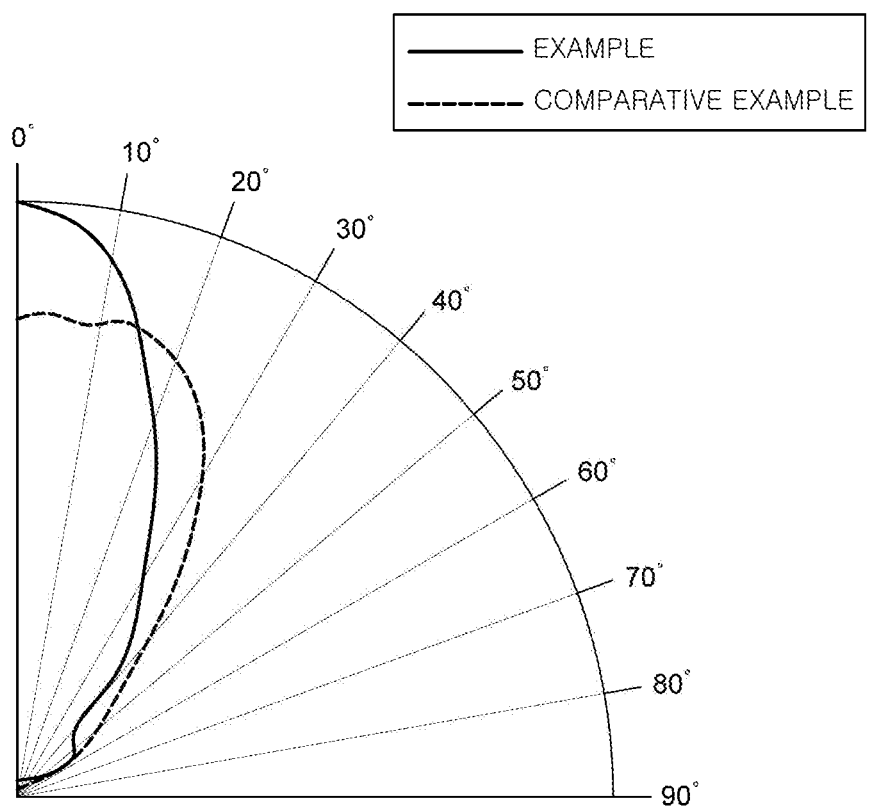
FIG. 8 is a graph for explaining a light distribution of a lighting apparatus including an organic light emitting diode according to an exemplary aspect of the present disclosure.

FIG. 7 is a view illustrating an emission path of a lighting apparatus including an organic light emitting diode according to an exemplary aspect of the present disclosure. FIG. 8 is a graph for explaining a light distribution of a lighting apparatus including an organic light emitting diode according to an exemplary aspect of the present disclosure.

The external light extraction layer 130 refracts the light generated by the organic light emitting diode unit 110 while maintaining a predetermined angle to the front to improve the front luminance.

Specifically, as illustrated in FIGS. 1 and 7, the external light extracting layer 130 is attached to a rear surface of the organic light emitting diode unit 110 which is a light extracting direction and the external light extracting layer 130 includes at least one unit structure having a four-sided pyramid shape. Specifically, a cross-section of the unit structure having a four-sided pyramid shape may be a triangle.

A vertex angle of the unit structure having a regular four-sided pyramid is 90 and a length L of one side of lower bases is 1 μm to 500 μm.

If the length of the lower base of the unit structure is smaller than 1 μm, a pattern density by the unit structure is increased so that a moiré phenomenon that the light emitted from the lighting apparatus 100 looks like wave may be generated.

In contrast, when the length L of the lower base of the unit structure is 500 μm or larger, the auxiliary line AL disposed in the non-emission area is directly exposed so that the pattern is recognized in the outside to lower the visibility.

Therefore, a length L of one side of lower bases of the unit structure having a four-sided pyramid shape may be determined to be 1 μm to 500 μm.

That is, the first electrode 115 of the organic light emitting diode of the related art is formed as a single layer to form a weak resonance structure so that it is restricted to concentrate light generated by the organic light emitting diode in a specific direction. In contrast, the light generated by the organic light emitting diode is diverged in random directions so that the front luminance concentration of the lighting apparatus is lowered.

However, referring to FIG. 7, in the lighting apparatus 100 using an organic light emitting diode of the present disclosure, the light is emitted from the organic light emitting diode unit 110 with an angle with respect to a normal direction of the organic layer 116 and the deflected light is refracted by the external light extracting layer 130 to a front direction which is a normal direction of the organic layer 116.

Specifically, the unit structure having a four-sided pyramid shape of the external light extracting layer 130 has a maximum front luminance contribution rate for light which is incident approximately at 17 degrees. The reflectance of the first electrode 115 may be adjusted by adjusting a thickness of the intermediate electrode 115b and thus the intensity of resonance varies so that an outgoing angle of the light may vary. By doing this, the incident angle of light which is incident onto the unit structure having a four-sided pyramid shape is controlled to be approximately 17 degrees to improve the front luminance.

As a result, in the lighting apparatus 100 using an organic light emitting diode according to an exemplary aspect of the present disclosure, the front luminance is improved to reach 12000 nit.

Referring to FIG. 8, it is confirmed that in the lighting apparatus of the related art which is a comparative example of the present disclosure, light having a similar intensity is generated around 0° to 30°.

In contrast, in the case of the lighting apparatus 100 of the exemplary aspect of the present disclosure, when the luminance is most concentrated around 0° of the light distribution and the luminance is sharply reduced at 30°.

Therefore, it is confirmed that in the lighting apparatus 100 using an organic light emitting diode according to an exemplary aspect of the present disclosure, the luminance is concentrated on the front surface so that the front luminance is improved.

Hereinafter, it will be described that the front luminance of the lighting apparatus 100 varies depending on a configuration of the first electrode 115 with respect to FIGS. 9A and 9B.

Figure 9A:
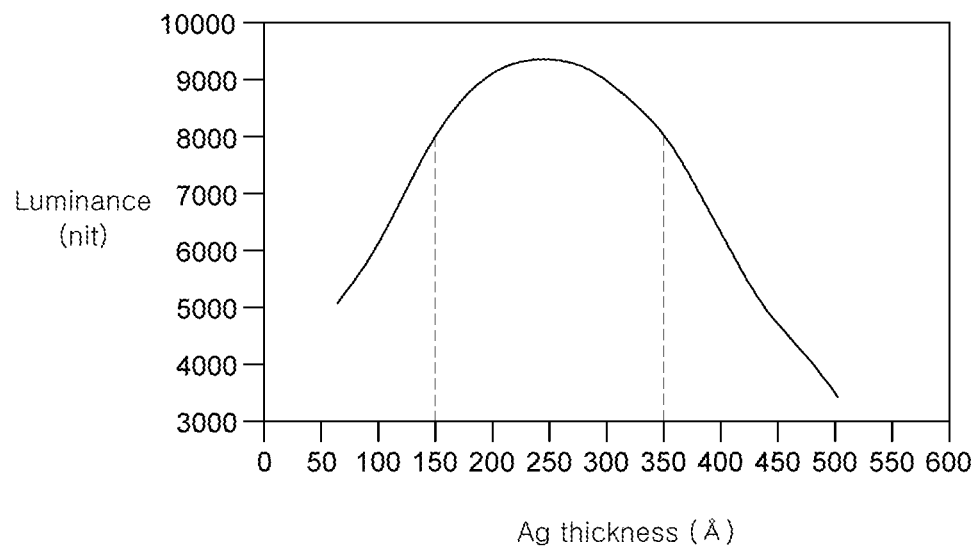
FIG. 9A is a graph illustrating a relationship of a front luminance in accordance with a thickness of an intermediate electrode of an exemplary aspect of the present disclosure.
Figure 9B:
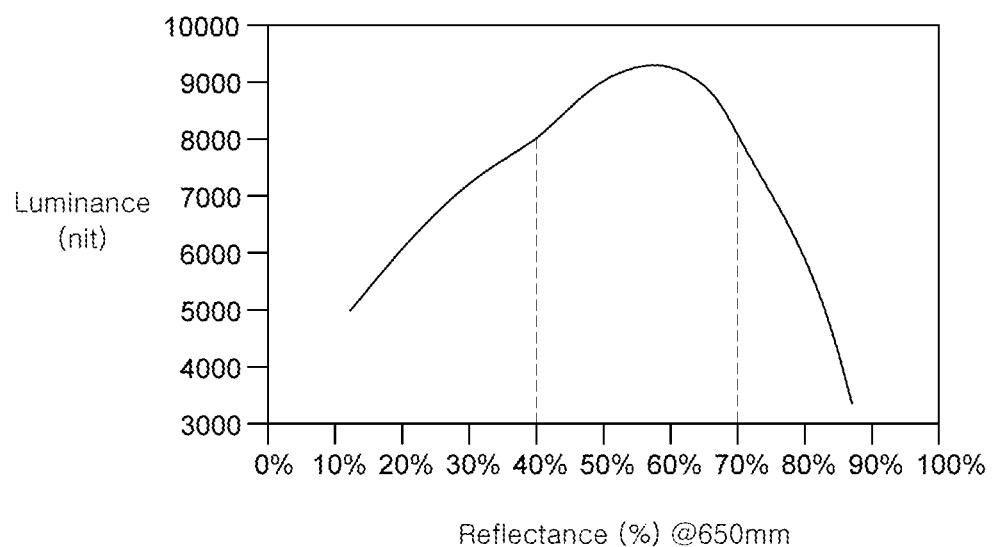
FIG. 9B is a graph illustrating a relationship of a front luminance in accordance with a reflectance of a first electrode of an exemplary aspect of the present disclosure.

FIG. 9A is a graph illustrating a relationship of a front luminance in accordance with a thickness of an intermediate electrode of an exemplary aspect of the present disclosure and FIG. 9B is a graph illustrating a relationship of a front luminance in accordance with a reflectance of a first electrode of an exemplary aspect of the present disclosure.

Referring to FIG. 9A, as described above, when the intermediate electrode 115b which is configured of silver (Ag) has a thickness of 150 Å to 350 Å, the lighting apparatus 100 may have a front luminance of 8000 nit or higher.

Therefore, the front luminance is improved when the thickness of the intermediate electrode 115b is 150 Å to 350 Å. Further, referring to FIG. 9B, the front luminance of the lighting apparatus 100 varies depending on a reflectance of the first electrode 115 with respect to light having a wavelength of 650 nm.

Specifically, when the reflectance of the first electrode 115 with respect to light having a wavelength of 650 nm is 40% to 70%, the lighting apparatus 100 may have a front luminance of 8000 nit or higher.

Therefore, when the reflectance of the first electrode 115 with respect to light having a wavelength of 650 nm is 40% to 70%, the front luminance is improved.

Figure 10A:
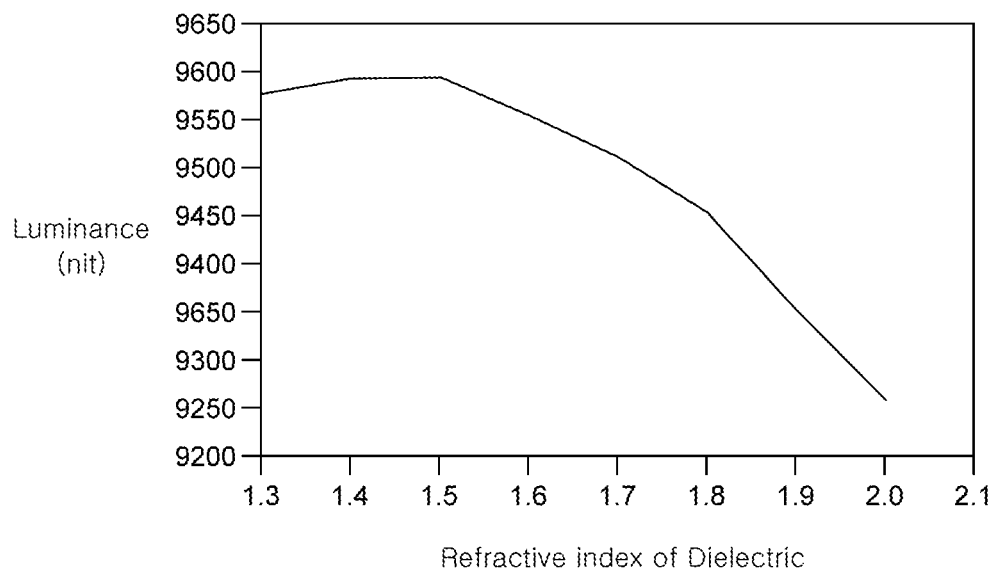
FIG. 10A is a graph illustrating a relationship of a front luminance in accordance with a refractive index of a lower electrode of an exemplary aspect of the present disclosure.
Figure 10B:
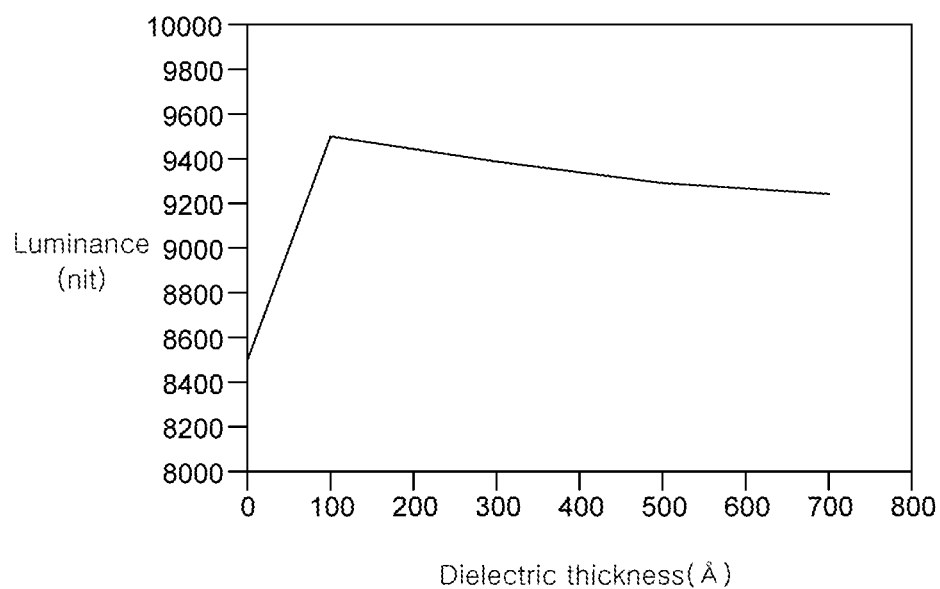
FIG. 10B is a graph illustrating a relationship of a front luminance in accordance with a thickness of a lower electrode of an exemplary aspect of the present disclosure.

FIG. 10A is a graph illustrating a relationship of a front luminance in accordance with a refractive index of a lower electrode of an exemplary aspect of the present disclosure and FIG. 10B is a graph illustrating a relationship of a front luminance in accordance with a thickness of a lower electrode of an exemplary aspect of the present disclosure.

Referring to FIG. 10A, when the lower electrode 115a is a dielectric having a refractive index of 1.4 to 1.5, the lighting apparatus 100 outputs a maximum front luminance of 9600 nit or higher.

Therefore, when the lower electrode 115a has a refractive index of 1.4 to 1.5, the front luminance is improved.

Further, referring to FIG. 10B, when a thickness of the lower electrode 115a which is composed of a dielectric is 100 Å, the lighting apparatus 100 may output a maximum front luminance of 9500 nit or higher. Further, it is also confirmed that when the thickness of the lower electrode 115a is increased to be larger than 100 Å, the front luminance of the lighting apparatus 100 is slightly reduced from the maximum front luminance.

Therefore, when the thickness of the lower electrode 115a is 100 Å, the front luminance is improved.

The exemplary aspects of the present disclosure can also be described as follows:

According to an aspect of the present disclosure, A lighting apparatus using an organic light emitting diode comprise an organic light emitting diode unit which includes an organic layer disposed on a substrate and emits light with an angle with respect to a normal direction of the organic layer; and an external light extracting layer which refracts light generated by the organic light emitting diode unit to the normal direction.

The external light extracting layer may include at least one unit structure having a four-sided pyramid shape.

A vertex angle of the unit structure may be 90°

A lower base of the unit structure may be a square whose one side has a length of 1 μm to 500 μm.

The organic light emitting diode unit may further include a first electrode and a second electrode attached onto both surfaces of the organic layer, and the first electrode may include an upper electrode which is in contact with the organic layer, an intermediate electrode which is in contact with the upper electrode, and a lower electrode which is in contact with the intermediate electrode.

The upper electrode is composed of indium tin oxide (ITO) having a thickness smaller than 1000 Å.

The intermediate electrode may be composed of a metal layer having a thickness of 150 Å to 350 Å.

A refractive index of the lower electrode may be 1.4 to 1.5.

A reflectance of the first electrode may be 40% to 70%

The organic light emitting diode unit may further include an auxiliary line which is electrically connected to the first electrode.

The auxiliary line may be disposed between the organic layer and the upper electrode.

The auxiliary line may be disposed between the upper electrode and the intermediate electrode.

The auxiliary line may be disposed between the intermediate electrode and the lower electrode.

The auxiliary line may be disposed between the lower electrode and the substrate.

The organic layer may include at least one organic light emitting layer and a charge generating layer is disposed between the at least one organic light emitting layer.

The at least one organic light emitting layer may comprise a first organic light emitting layer and a second organic light emitting layer and each of the first organic light emitting layer and the second organic light emitting layer includes a red dopant.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus including an organic light emitting diode, comprising:
   an organic light emitting diode unit which includes an organic layer disposed on a substrate, wherein the organic light emitting diode emits light with an angle with respect to a normal direction of the organic layer;
   an external light extracting layer which refracts the light emitted by the organic light emitting diode unit to the normal direction of the organic layer; and
   a first electrode and a second electrode attached to both surfaces of the organic layer, wherein the first electrode includes an upper electrode in contact with the organic layer, an intermediate electrode in contact with the upper electrode, and a lower electrode in contact with the intermediate electrode, and wherein the intermediate electrode includes a metal layer having a thickness of 150 Å to 350 Å.

2. The lighting apparatus according to claim 1, wherein the external light extracting layer includes a plurality of light extracting unit structures that has at least one unit structure having a four-sided pyramid shape.

3. The lighting apparatus according to claim 2, wherein the unit structure has a vertex angle of 90°.

4. The lighting apparatus according to claim 2, wherein of the unit structure has a lower base of a square shape with one side having a length of 1 μm to 500 μm.

5. The lighting apparatus according to claim 1, wherein the upper electrode includes indium tin oxide (ITO) having a thickness smaller than 1000 Å.

6. The lighting apparatus according to claim 1, wherein the lower electrode has a refractive index of 1.4 to 1.5.

7. The lighting apparatus according to claim 1, wherein the first electrode has a reflectance of 40% to 70%.

8. The lighting apparatus according to claim 1, wherein the organic light emitting diode unit further includes an auxiliary line which is electrically connected to the first electrode.

9. The lighting apparatus according to claim 8, wherein the auxiliary line is disposed between the organic layer and the upper electrode.

10. The lighting apparatus according to claim 8, wherein the auxiliary line is disposed between the upper electrode and the intermediate electrode.

11. The lighting apparatus according to claim 8, wherein the auxiliary line is disposed between the intermediate electrode and the lower electrode.

12. The lighting apparatus according to claim 8, wherein the auxiliary line is disposed between the lower electrode and the substrate.

13. The lighting apparatus according to claim 1, wherein the organic layer includes, a first organic light emitting layer and a second organic light emitting layer, and a charge generating layer disposed between the first organic light emitting layer and the second organic light emitting layer.

14. The lighting apparatus according to claim 13, wherein each of the first organic light emitting layer and the second organic light emitting layer includes a red dopant.

15. A lighting apparatus comprising:

an organic light emitting diode unit that performs surface emission, an encapsulating unit encapsulating the organic light emitting diode unit, wherein the organic light emitting diode unit includes an organic layer emitting light; a first electrode attached to one surface of the organic layer; and a second electrode attached to other surface of the organic layer; and an auxiliary line that compensates for a conductivity of the first electrode and an insulating layer that suppresses short-circuit of the first electrode and the second electrode, wherein the first electrode includes an upper electrode in contact with the organic layer, an intermediate electrode in contact with the upper electrode, and a lower electrode in contact with the intermediate electrode;

an external light extracting layer including a plurality of protrusions each having a four-sided pyramid shape that refracts the light emitted from the organic light emitting diode unit to a front side of the lighting apparatus, and wherein the auxiliary line is disposed between the organic layer and the upper electrode, or the upper electrode and the intermediate electrode, or the intermediate electrode and the lower electrode.

16. The lighting apparatus according to claim 2, wherein the plurality of protrusions has a vertex angle of 90°.

17. The lighting apparatus according to claim 2, wherein the plurality of protrusions has a lower base of a square shape with one side having a length of 1 μm to 500 μm.

* * * * *